United States Patent
Seki et al.

(10) Patent No.: US 8,430,706 B2
(45) Date of Patent: Apr. 30, 2013

(54) ORGANIC ELECTROLUMINESCENT DEVICE AND METHOD OF MANUFACTURING ORGANIC ELECTROLUMINESCENT DEVICE

(75) Inventors: Shunichi Seki, Suwa (JP); Masashi Goto, Chino (JP)

(73) Assignee: Seiko Epson Corporation, Tokyo (JP)

( * ) Notice: Subject to any disclaimer, the term of this patent is extended or adjusted under 35 U.S.C. 154(b) by 588 days.

(21) Appl. No.: 11/847,911

(22) Filed: Aug. 30, 2007

(65) Prior Publication Data

US 2008/0074039 A1    Mar. 27, 2008

(30) Foreign Application Priority Data

Sep. 27, 2006   (JP) .................................. 2006-262314

(51) Int. Cl.
*H05B 33/10*    (2006.01)
(52) U.S. Cl.
USPC ............................................ 445/58; 313/504
(58) Field of Classification Search .......... 313/498–512; 315/169.3; 345/36, 45, 76
See application file for complete search history.

(56) References Cited

U.S. PATENT DOCUMENTS

| | | | | |
|---|---|---|---|---|
| 2,934,516 | A * | 4/1960 | Hicks | 528/112 |
| 2003/0001984 | A1* | 1/2003 | Yokoyama et al. | 349/61 |
| 2003/0032361 | A1* | 2/2003 | Murasko et al. | 445/24 |
| 2004/0097101 | A1* | 5/2004 | Kwong et al. | 438/781 |
| 2005/0186106 | A1 | 8/2005 | Li et al. | |
| 2005/0244672 | A1* | 11/2005 | Che et al. | 428/690 |
| 2006/0029749 | A1* | 2/2006 | Hatada et al. | 428/1.4 |
| 2007/0176167 | A1* | 8/2007 | Parthasarathy et al. | 257/40 |

FOREIGN PATENT DOCUMENTS

| | | |
|---|---|---|
| JP | A 10-083888 | 3/1998 |
| JP | A-2005-239789 | 9/2005 |
| JP | A-2005-243300 | 9/2005 |
| JP | A-2005-302566 | 10/2005 |

\* cited by examiner

*Primary Examiner* — Nimeshkumar Patel
*Assistant Examiner* — Christopher Raabe
(74) *Attorney, Agent, or Firm* — Oliff & Berridge, PLC (57) ABSTRACT

A method of manufacturing an organic electroluminescent device having at least two successive light-emitting layers formed between a pair of electrodes using a liquid phase method includes: forming a first light-emitting layer on a base using the liquid phase method and performing an insolubilization process on the first light-emitting layer; and forming a second light-emitting layer on the first light-emitting layer, on which the insolubilization process has been performed, using the liquid phase method. In the insolubilization process, an insoluble layer that is not soluble in a solvent that dissolves the second light-emitting layer is formed on at least an upper surface of the first light-emitting layer.

11 Claims, 6 Drawing Sheets

ORGANIC ELECTROLUMINESCENT DEVICE AND METHOD OF MANUFACTURING ORGANIC ELECTROLUMINESCENT DEVICE

BACKGROUND

1. Technical Field

The present invention relates to an organic electroluminescent device and a method of manufacturing an organic electroluminescent device.

2. Related Art

Organic electroluminescent devices (hereinafter, referred to as 'organic EL devices') have been drawing attention as next-generation display devices. Such an organic EL device is formed by providing an organic EL element, in which a light-emitting layer is interposed between upper and lower electrodes, on a base. Typically, a structure in which an anode, an organic functional layer (hole injection layer, light-emitting layer, and the like) and a cathode are sequentially laminated on a transmissive substrate, such as glass, is adopted for the organic EL device. In addition, the light-emitting layer is caused to emit light by supplying a current to the organic functional layer by means of the anode and the cathode.

It is desirable to improve the luminous efficiency of the organic EL device. Accordingly, JP-A-10-83888 proposes an organic EL device with high brightness and high efficiency in which an organic functional layer is configured to include a hole transporting layer and light-emitting dopants and an electron transporting layer and light-emitting dopants.

However, the organic functional layer is formed by using a vapor deposition method. In the case of a process using such vapor deposition method, for example, if the size of a substrate increases, the workability is decreased. As a result, a manufacturing cost is increased. For this reason, it is demanded to manufacture the organic functional layer, such as a light-emitting layer, by using a liquid phase method, for example, an ink jet method. However, in the case of using an ink jet method, it is difficult to satisfactorily laminate a plurality of light-emitting layers. Accordingly, a problem occurs in that the luminous efficiency of the formed light-emitting layer decreases or the life time of the light-emitting layer becomes short.

SUMMARY

An advantage of some aspects of the invention is that it provides an organic electroluminescent device and a method of manufacturing an organic electroluminescent device that allows a light-emitting layer having a multi-layered structure to be manufactured using a liquid phase method, thereby realizing a low cost.

According to an aspect of the invention, a method of manufacturing an organic electroluminescent device having at least two successive light-emitting layers formed between a pair of electrodes using a liquid phase method includes: forming a first light-emitting layer on a base using the liquid phase method and performing an insolubilization process on the first light-emitting layer; and forming a second light-emitting layer on the first light-emitting layer, on which the insolubilization process has been performed, using the liquid phase method. The insolubilization process, an insoluble layer that is not soluble in a solvent that dissolves the second light-emitting layer is formed on at least an upper surface of the first light-emitting layer.

In the method of manufacturing an organic electroluminescent device according to the aspect of the invention, the insoluble layer that is not soluble in a solvent that dissolves the second light-emitting layer is formed on the first light-emitting layer on which the insolubilization process has been performed. Accordingly, since the first light-emitting layer does not dissolve at the time of forming the second light-emitting layer using the liquid phase method, the first light-emitting layer and the second light-emitting layer can be successively formed. Thus, since the light-emitting layers that are deposited in succession can be formed using the liquid phase method, a material is not wasted. As a result, even a large-sized organic EL device can be provided with a low cost.

Further, in the method of manufacturing an organic electroluminescent device described above, preferably, a hole transporting material is used for the first light-emitting layer and an electron transporting material is used for the second light-emitting layer.

According to the configuration described above, light-emitting layers serving as a hole transporting layer and an electronic transporting layer can be laminated in a state where the light-emitting layers are reliably coated and divided. As a result, a highly reliable organic EL device can be provided using the liquid phase method.

Furthermore, in the method of manufacturing an organic electroluminescent device described above, preferably, an organic material having a cross-linking property is used for the first light-emitting layer, and the insoluble layer is formed by cross linking the first light-emitting layer in the insolubilization process.

According to the configuration described above, the insoluble layer is formed by cross linking on at least the upper surface of the first light-emitting layer, that is, at an interface between the first light-emitting layer and the second light-emitting layer. As a result, since the insolubilization process on the first light-emitting layer can be reliably performed, the second light-emitting layer can be formed on the first light-emitting layer in a state where the first light-emitting layer and the second light-emitting layer are deposited in succession using the liquid phase method.

In addition, according to another aspect of the invention, an organic electroluminescent device having at least two successive light-emitting layers formed between a pair of electrodes using a liquid phase method includes: a first light-emitting layer formed by using the liquid phase method; and a second light-emitting layer formed on the first light-emitting layer using the liquid phase method. An insoluble layer that is not soluble in a solvent that dissolves the second light-emitting layer is formed on at least an upper surface of the first light-emitting layer.

In the organic electroluminescent device according to the aspect of the invention, the insoluble layer that is not soluble in a solvent that dissolves the second light-emitting layer is formed on the first light-emitting layer on which the insolubilization process has been performed. Accordingly, since the first light-emitting layer does not dissolve at the time of forming the second light-emitting layer using the liquid phase method, the first light-emitting layer and the second light-emitting layer can be successively formed. Thus, since the light-emitting layers that are deposited in succession can be formed using the liquid chase method, a material is not wasted. As a result, even a large-sized organic EL device can be provided with a low cost.

Furthermore, in the organic electroluminescent device described above, preferably, the first light-emitting layer is formed of a hole transporting material and the second light-emitting layer is formed of an electron transporting material.

According to the configuration described above, light-emitting layers serving as a hole transporting layer and an electronic transporting layer can be laminated in a state where the light-emitting layers are reliably coated and divided. As a result, even in the case of using the liquid phase method, a highly reliable organic electroluminescent device can be provided with a low cost.

In addition, in the organic electroluminescent device described above, preferably, the first light-emitting layer contains an organic material having a cross-linking property, and the insoluble layer is formed by cross linking the first light-emitting layer.

According to the configuration described above, the insoluble layer formed by cross linking is provided at an interface between the first light-emitting layer and the second light-emitting layer. Accordingly, since the first light-emitting layer does not dissolve, the first light-emitting layer and the second light-emitting layer can be successively formed. As a results a highly reliable organic electroluminescent device can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanying drawings. In the following description, the layer thickness or the scale of each constituent component is adjusted in order to have a recognizable size in the drawings.

First Embodiment

Figure 1:
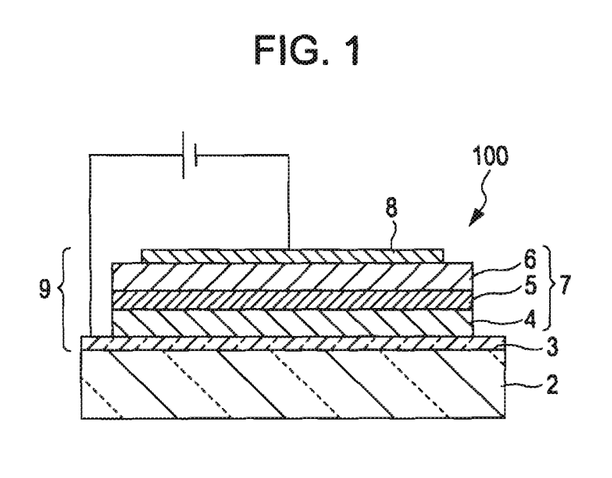
FIG. 1 is a view schematically illustrating the configuration of an organic EL device according to a first embodiment of the invention.

FIG. 1 is a view schematically illustrating the configuration of an organic EL device according to a first embodiment of the invention. An organic EL device 100 according to the present embodiment is a so-called bottom-emission-type organic EL device in which light emitted from an organic EL element 9 is emitted from a base 2 formed of, for example, a glass substrate and is then emitted to the outside. Moreover, in the following description, electrons and holes injected into a light-emitting layer may be referred to as carriers.

The organic EL device 100 includes an anode 3 serving as a first electrode, a hole injection layer 4, a first light-emitting layer 5, a second light-emitting layer 6, and a cathode 8 serving as a second electrode, which are formed on the base 2. The hole injection layer 4, the first light-emitting layer 5, and the second light-emitting layer 6 are formed of an organic material, and these organic material layers form an organic functional layer 7. In addition, the organic functional layer 7 is interposed between the anode 3 and the cathode 8. The anode 3, the organic functional layer 7, and the cathode 8 form the organic EL element 9.

Wiring lines used to apply a driving voltage are connected to the anode 3 and the cathode 8. When a driving voltage is applied between the electrodes through the wiring lines, electrons are injected from the cathode 8 into the second light-emitting layer 6 and holes are injected from the anode 3 into the first light-emitting layer 5. The holes and electrons move through the first light-emitting layer 5 or the second light-emitting layer 6 in response to an applied electric field, and recombination of the holes and the electrons occurs at an interface between the light-emitting layers 5 and 6. Excitons are generated due to energy emitted at the time of recombination. When the excitons return to a ground state, energy is emitted in the form of fluorescent light or phosphorescent light.

In the bottom-emission-type organic EL device, the anode 3 needs to be formed of a transparent material. Such transparent materials for electrodes include Pt, Ir, Ni, and Pd as well as ITO used in the present embodiment.

In addition, an arylamine derivative, a phthalocyanine derivative, a polyaniline derivative+organic acid, a polythlophene derivative+polymer acid, or the like is used for the hole injection layer 4. In the present embodiment, a compound (PEDOT/PSS) of a polyethylenedioxythiophene and polystyrene sulfonic acid is used.

As a material for forming the first light-emitting layer 5, a hole transporting material that emits yellow and green light is used.

As such light-emitting material, a precursor of a conjugated polymer organic compound conjugated by heat treatment is preferably used, for example.

The precursor of the conjugated polymer organic compound is discharged to be formed in the form of a thin film by means of an ink jet method (liquid phase method) which will be described later, and is then heated and cured as expressed in the following [Chemical formula 1], which will be described in detail later, thereby forming a light-emitting layer serving as a conjugated polymer organic EL layer.

[CHEMICAL FORMULA 1]

PPV PRECURSOR

PPV

[CHEMICAL FORMULA 2]

F8-BT

Such a conjugated polymer organic compound has strong fluorescence in solid form and may be formed as a homogeneous solid film, which is very thin. Moreover, since the precursor of the compound forms a firm conjugated polymer film after being cured, a precursor solution can be adjusted to have a desired viscosity applicable to liquid droplet discharge patterning, which will be described later, before heating and curing. Thus, it is possible to easily perform film formation within a short period of time and under optimal conditions.

As the above precursor, for example, a precursor of PPV (poly(paraphenylenevinylene)) or a derivative thereof is preferable. Since the precursor of PPV or the derivative thereof is soluble in water or organic solvent or may be polymerized, it is possible to obtain a high-quality thin film from an optical point of view.

The precursor of PPV or the derivative thereof is soluble in methanol/water and conjugated by heat treatment after film formation, thereby forming a PPV layer. Preferably, the content of a precursor represented by the PPV precursor is 0.01 to 10.0 wt % of the whole composition. More preferably, the content of the precursor is 0.1 to 5.0 wt %. The reason for this is that if the amount of added precursor is too small, the precursor is not sufficient to form a conjugated polymer film and if the amount of added precursor is too large, the viscosity of the composition increases, and accordingly, the amount of added precursor may not be suitable for high-precision patterning using an ink jet method.

As a material for forming the second light-emitting layer 6, an electron transporting material that emits yellow and green light in the same manner as the first light-emitting layer 5 is used.

As such a light-emitting material, a conjugated polymer organic material called a polyfluorene derivative (polyfluorene copolymer), for example, F8BT expressed in [chemical formula 2] is used.

In order to efficiently transport electrons injected from the cathode 8 toward the first light-emitting layer 5, a material having an electric reduction potential smaller than that of the first light-emitting layer 5 is preferably used for the second light-emitting layer 6 having electron transportability. In addition, in order to prevent holes, which are injected from the hole injection layer 4 into the first light-emitting layer 5, from passing toward the cathode 8 without being recombined at an approximate interface between the first light-emitting layer 5 and the second light-emitting layer 6, a material having an electric oxidation potential larger than that of a light-emitting material for forming the first light-emitting layer 5 is preferably used as a material for forming the second light-emitting layer.

Thus, an interface at which carrier transportability varies is generated inside a light-emitting layer configured to include the first light-emitting layer 5 and the second light-emitting layer 6, and it is possible to control a light-emitting (recombination) region near the interface between the first light-emitting layer 5 and the second light-emitting layer 6. Accordingly, since the organic EL device 100 can emit light near the interface between the first light-emitting layer 5 and the second light-emitting layer 6, a light-emitting region is distant from the electrodes 3 and 8. As a result, since it is possible to suppress quenching at a metal interface, a high luminous efficiency can be obtained.

Method of Manufacturing an Organic EL Device

Next, as a method of manufacturing an organic EL device according to an embodiment of the present invention, a method of manufacturing the organic EL device 100 will be described with reference to FIGS. 2A to 2C.

Figure 2A:
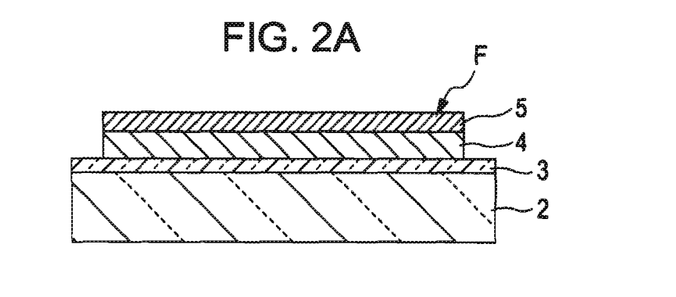
FIG. 2A is a process view explaining a method of manufacturing the organic EL device.

First, as shown in FIG. 2A, the hole injection layer 4 and the first light-emitting layer 5 are formed on the base 2, on which the anode 3 is formed, using a liquid phase method. A spin coating method, a liquid droplet discharge method (ink jet method), a dip coating method, a roll coating method, and the like may be applied as a liquid phase method. Among those methods, the liquid droplet discharge method is preferably used because a material is negligible and a desired amount of material can be exactly disposed at the desired position. Particularly in the present embodiment, the ink jet method is used when forming the first light-emitting layer 5 and the second light-emitting layer 6. Moreover, a partition wall structure for making patterned films clear is not shown in the drawing.

The liquid droplet discharge method (ink jet method) includes an electrification control method, a pressure oscillation method, an electromechanical conversion method, an electrothermal conversion method, and an electrostatic attraction method. In the electrification control method, electric charges are supplied to a material by a charged electrode, and the flying direction of the material is controlled by a deflecting electrode so that the material is discharged from a nozzle. Further, in the pressure oscillation method, a material is discharged toward a front end of a nozzle by applying a very high voltage to the material. In this case, if a control voltage is not applied, a material moves straight to be discharged from a nozzle. In addition, if the control voltage is applied, an electrostatic repulsion occurs between components of a material, and as a result, the material disperses such that the material is not discharged from the nozzle. Furthermore, in the electromechanical conversion method (piezo method), a property of a piezoelectric element that deforms when an electric pulse signal is applied to the piezoelectric element is used. Specifically, using such deformation of the piezoelectric element, the pressure is applied to a space where a material is stored through a flexible material and the material is extruded from the space, such that the material is discharged from a nozzle. Furthermore, in the electrothermal conversion method, bubbles are generated by rapidly evaporating a material using a heater provided in a space where a material is stored, and the material within the space is discharged due to the pressure of the bubbles. In the electrostatic attraction method, the minute pressure is applied to the space where a material is stored, a meniscus of the material is formed in a nozzle, and the material is pulled out by applying an electrostatic attraction force in this state. In addition to those methods described above, techniques, such as a method of using the viscosity change of fluid occurring in response to an applied electric field and a blowing method using a discharge spark, may also be applied.

For example, the hole injection layer 4 is formed by disposing a liquid material containing 3,4-polyethylenedioxythiophene/polystyrene sulfonic acid (PEDOT/PSS), which is a material for forming a hole injection layer, on the first electrode 3 and drying and baking (at 200° C. for 10 minutes the liquid material. It is preferable that the thickness of the hole injection layer 4 is 20 nm to 100 nm. In the present embodiment, the thickness of the hole injection layer 4 is 50 nm. In addition, as a solvent of the material for forming a hole injection layer, a mixture of polar solvents, such as isopropyl alcohol, N-methylpyrrolidone, and 1,3-dimethylimidazolinone, may be used.

Then, the first light-emitting layer 5 is formed on the hole injection layer 4 using the ink jet method. Specifically, the first light-emitting layer 5 configured to include a PPV precursor may be formed by discharging a liquid material, which contains a light-emitting material (PPV precursor) expressed in [Chemical formula 1], on the hole injection layer 4 through an Ink jet head and drying the discharged liquid material. In addition, as the film thickness of the first light-emitting layer 5, a thickness of about 40 nm is preferable. In addition, 0.5 to 10 wt % of a hole transporting material, such as an aromatic tertiary amine, may be mixed with the material for forming the first light-emitting layer 5, such that the hole transportability of an organic EL device can be further improved.

Insolubilization Process

Subsequently, an insolubilization process (conjugation process) is performed on the first light-emitting layer 5 by performing heat treatment (at 150° C. for 4 hours) on the first light-emitting layer 5 under an inert gas (nitrogen $N_2$ gas) atmosphere. The insolubilization process is a process for causing the first light-emitting layer 5 to be made insoluble in a solvent containing a material, which is used to form the second light-emitting layer 6 formed by the ink jet method liquid phase method). In the present embodiment, the first light-emitting layer 5 formed of PPV functions as an insoluble layer F. In addition, a polar solvent, such as methanol, DMF, and glycol, is used as a solvent of the liquid material (PPV precursor). Moreover, it is possible to prevent the hole injection layer 4 from dissolving by adding a coupling material, such as γ-glycidyloxypropyl trimethoxy silane, to the material for forming a hole injection layer.

Figure 2B:
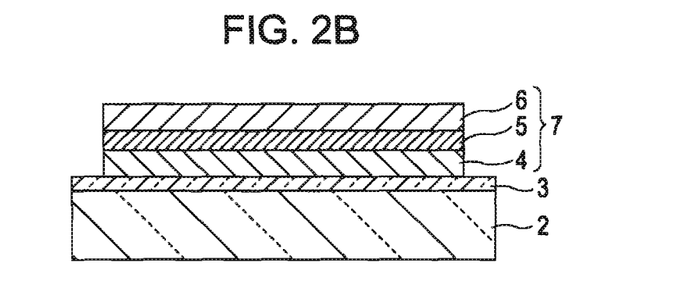
FIG. 2B is a process view explaining a method of manufacturing the organic EL device.

Then, as shown in FIG. 2B, the second light-emitting layer 6 is formed on the first light-emitting layer 5 using the ink jet method (liquid phase method). The polyfluorene derivative described above is used for the second light-emitting layer 6. Specifically, the second light-emitting layer 6 is formed by disposing a liquid material (40 nm), which contains an electron transporting material expressed in [Chemical formula 2], on the first light-emitting layer 5 and performing heat treatment (at 130° C. for 30 minutes) on the liquid material under an inert gas (for example, nitrogen) atmosphere. Moreover, an aromatic non-polar solvent, such as xylene, trimethylbenzene, and cyclohexylbenzene, or a mixed solvent thereof is used as a solvent of the second light-emitting layer 6. In addition, 0.5 to 10 wt % of an organic metal compound having electron transportability, such as $Alq_3$, may be mixed with the material for forming the second light-emitting layer 6, such that the electron transportability of the organic EL device can be further improved.

Here, since the first light-emitting layer 5 becomes a layer that is not soluble in the non-polar solvent by means of the insolubilization process, the first light-emitting layer 5 does not dissolve in the solvent even if the liquid material for forming the second light-emitting layer 6 is disposed on the first light-emitting layer 5. Through the processes described above, the first light-emitting layer 5 and the second light-emitting layer 6 that are deposited in succession can be satisfactorily formed using the ink jet method (liquid phase method).

Figure 2C:
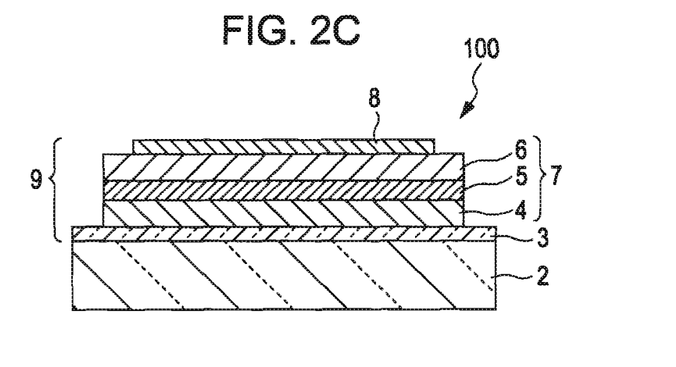
FIG. 2C is a process view explaining a method of manufacturing the organic EL device.

Then, as shown in FIG. 2C, the cathode 8 is formed on the second light-emitting layer 6. The cathode 8 may be formed by sequentially laminating lithium fluoride, calcium aluminum, and the like using a vacuum deposition method, for example. Specifically, in the present embodiment, the cathode 8 is formed using a laminated structure of calcium (20 nm) and aluminum (200 nm). Thus, the organic EL element 9 is formed on the base 2. Then, a sealing process is performed as needed. Thus, the organic EL device 100 is completed.

As described above, in the organic EL device 100 according to the present embodiment, the second light-emitting layer 6 is formed on the first light-emitting layer 5 on which the insolubilization process has been performed using the ink jet method. Accordingly, since the first light-emitting layer 5 does not dissolve at the time of forming the second light-emitting layer 6, the first light-emitting layer 5 and the second light-emitting layer 6 can be successively formed. As a result, since a material is not wasted by forming the organic functional layer 7 using the ink jet method (liquid phase method), a cost can be significantly saved in the case when the organic EL device 100 is large.

Similarly, even in the method of manufacturing the organic EL device 100 according to the present embodiment, a highly reliable organic EL device can be provided with a low cost by using the ink jet method (liquid phase method).

Second Embodiment

Figure 3:
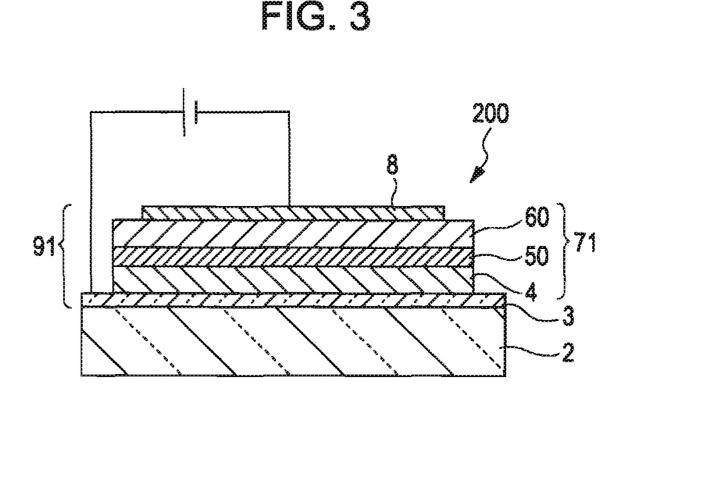
FIG. 3 is a view schematically illustrating the configuration of an organic EL device according to a second embodiment of the invention.

FIG. 3 is a view schematically illustrating the configuration of an organic EL device according to a second embodiment of the invention. An organic EL device 200 includes: an anode 3, a hole injection layer 4, a first light-emitting layer 50, and a second light-emitting layer 60 serving as first electrodes; and a cathode 8 serving as a second electrode, which are formed on a base 2. The hole injection layer 4, the first light-emitting layer 50, and the second light-emitting layer 60 are formed of an organic material, and these organic material layers form an organic functional layer 71. In addition, the organic functional layer 71 is interposed between the anode 3 and the cathode 8. The anode 3, the organic functional layer 71, and the cathode 8 form an organic EL element 91. In the present embodiment, the configuration of the organic EL device 200 is the same as that of the organic EL device 100 according to the first embodiment, which is shown in FIG. 1, except for the organic EL element 9. Accordingly, an explanation below will be focused on the configurations of the first light-emitting layer 50 and the second light-emitting layer 60 and a process of forming the first light-emitting layer 50 and the second light-emitting layer 60, and other explanations will be omitted.

In addition, an arylamine derivative, a phthalocyanine derivative, a polyaniline derivative+organic acid, a polythiophene derivative+polymer acid, or the like is used for the hole injection layer 4. In the present embodiment, a compound (PEDOT/PSS) of a polyethylenedioxythiophene and polystyrene sulfonic acid is used.

In addition, a material containing an organic material expressed in [Chemical formula 3], that is, poly[{9,9-dihexyl-2,7-bis(1-cyanovinylene)fluorenylene}-co-{2,5-bis(N—N'-diphenylamino)-1,4-phenylene}], and an organic material having a crosslinkable functional group, such as an epoxy group, and expressed in [Chemical formula 4], that is, poly(9,9-dioctylfluorene) derivative is preferably used for the first light-emitting layer 50. In addition, the first light-emitting layer 50 emits red light.

[CHEMICAL FORMULA 3]

[CHEMICAL FORMULA 4]

POLY(9,9-DIOCTYLFLUORENE)DERIVATIVER

In the organic material expressed in [Chemical formula 4], an end group of poly(9,9-dioctylfluorene) is subjected to end processing using phenyl epoxide. Accordingly, an epoxy group of phenyl epoxide has a thermal cross-linking property.

That is, since the first light-emitting layer 50 has a cross-linked structure in which the first light-emitting layer 50 is not soluble in a liquid material (solvent) used to form the second light-emitting layer 60, the first light-emitting layer 50 becomes a layer (insoluble layer) in which the organic material expressed in [Chemical formula 3] is mixed with the cross-linked organic material expressed in [Chemical formula 4]. Therefore, as described above, the first light-emitting layer 50 is not soluble in the solvent of the second light-emitting layer 60 even if the second light-emitting layer 60 is formed on the first light-emitting layer 50 using the ink jet method (liquid phase method).

The second light-emitting layer 60 is configured to contain the organic material, which is contained in the first light-emitting layer 50 and is expressed in [Chemical formula 3], and F8BT, which is used to form the second light-emitting layer 6 of the organic EL device 100 according to the first embodiment and is expressed in [Chemical formula 2], as light-emitting materials. In addition, the second light-emitting layer 60 emits red light in the same manner as the first light-emitting layer 50. In addition, the cathode 8 made of the same material as the organic EL device 100 is formed on the second light-emitting layer 60.

Method of Manufacturing an Organic EL Device

Next, a method of manufacturing the organic EL device 200 will be described with reference to FIGS. 4A to 4C.

Figure 4A:
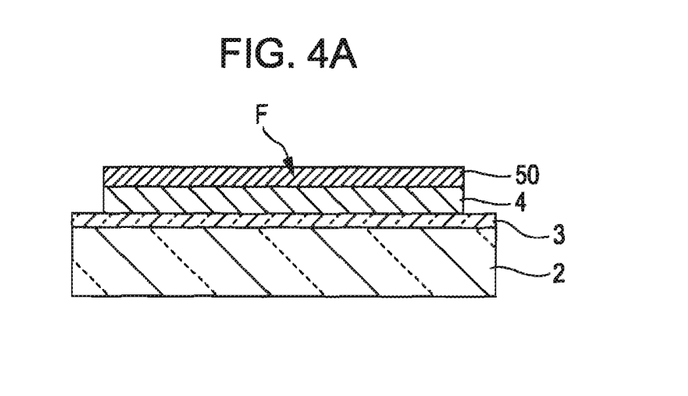
FIG. 4A is a process view explaining a method of manufacturing the organic EL device.

First, as shown in FIG. 4A, the first light-emitting layer 50 is formed on the base 2, on which the anode 3 and the hole injection layer 4 are formed, using an ink jet method (liquid phase method). In the same manner as described above, the first light-emitting layer 50 is formed by disposing a liquid material, which contains an organic material expressed in [Chemical formula 3] and an organic material that has a crosslinkable functional group such as an epoxy group and expressed in [Chemical formula 4], on the hole injection layer 4. In addition, as the film thickness of the first light-emitting layer 50, a thickness of about 40 nm is preferable.

Insolubilization Process

Subsequently, an insolubilization process is performed on the first light-emitting layer 50 by performing heat treatment (at 130 to 200° C. for 30 minutes) under an inert gas (for example, nitrogen) atmosphere. Specifically, in the present embodiment, the first light-emitting layer becomes not soluble by making poly(9,9-dioctylfluorene), which is a material used to form the first light-emitting layer 50 and whose end group is processed using phenyl epoxide, thermally cross linked. Further, in order to prevent the hole injection layer 4 from dissolving, an aromatic non-polar solvent, such as toluene, xylene, trimethylbenzene, and cyclohexylbenzene that are not soluble with respect to the hole injection layer 4, or a mixed solvent thereof can be used as a solvent of the first light-emitting layer 50.

Accordingly, the epoxy group, which is the cross-linkable functional group, is cross linked by heat treatment in the organic material (refer to [Chemical formula 4]) used to form the first light-emitting layer 50. As a result, the insoluble layer (cross-linked layer) F, which is not soluble in a solvent that dissolves the second light-emitting layer 60, is formed. The insoluble layer F may be formed on the entire first light-emitting layer 50 or may be formed only at an interface between the first light-emitting layer 50 and the second light-emitting layer 60. In the present embodiment, the insoluble layer F is formed on the entire first light-emitting layer 50. Accordingly, the first light-emitting layer 50 functions as the insoluble layer F. Moreover, in the case that the insoluble layer F is formed at least an interface between the first light-emitting layer 50 and the second light-emitting layer 60, the first light-emitting layer 50 does not dissolve in a solvent that dissolves the second light-emitting layer 60 when forming the second light-emitting layer 60 using the ink jet method.

Furthermore, although the phenyl epoxide has been used as a crosslinkable functional group in [Chemical formula 4] described above, an epoxy groups other than phenyl epoxide, a double bond group, and a cyclic ether group may also be used. In addition, although the crosslinkable functional group has been introduced to an end group of polymer, the crosslinkable functional group may also be introduced inside a principal chain skeleton of polymer or a side chain skeleton of polymer.

Figure 4B:
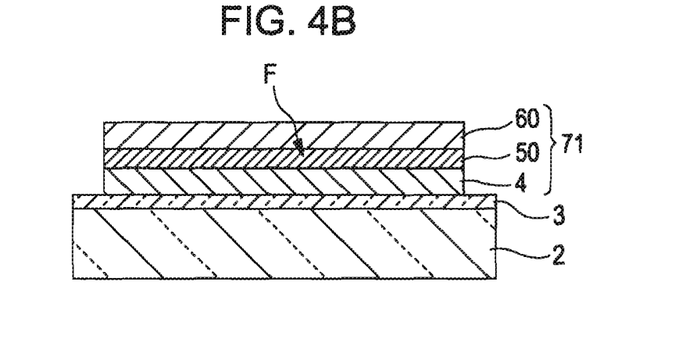
FIG. 4B is a process view explaining a method of manufacturing the organic EL device.

Then, as shown in FIG. 4B, the second light-emitting layer 60 is formed on the first light-emitting layer 50 using the ink jet method. A material and a method of forming the second light-emitting layer 60 are the same as those in the first embodiment. An aromatic non-polar solvent, such as xylene, trimethylbenzene, and cyclohexylbenzene, or a mixed solvent thereof is used as a solvent of a material for forming the second light-emitting layer. Since the first light-emitting layer 50 becomes a layer that is not soluble in the non-polar solvent by means of the insolubilization process described above, the first light-emitting layer 50 does not dissolve in the solvent due to the insoluble layer F even if the liquid material for forming the second light-emitting layer 60 is disposed on the first light-emitting layer 50. Through the processes described above, the first light-emitting layer 50 and the second light-emitting layer 60 that are deposited in succession can be satisfactorily formed using the ink jet method (liquid phase method).

Figure 4C:
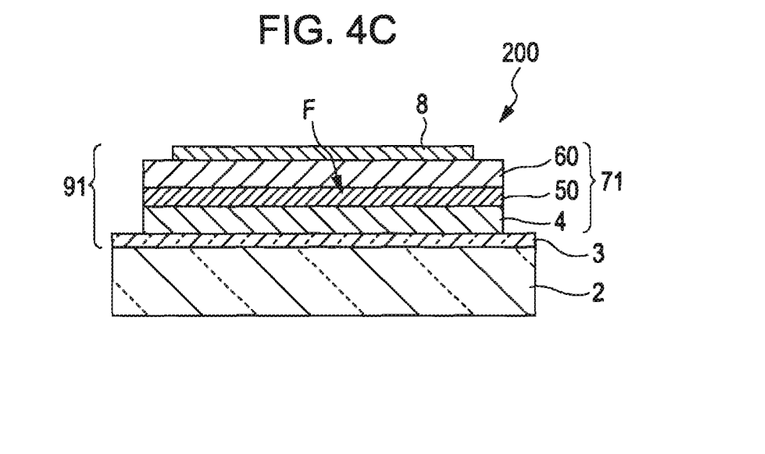
FIG. 4C is a process view explaining a method of manufacturing the organic EL device.

Then, as shown in FIG. 4C, the cathode 8 is formed on the second light-emitting layer 60 in the same manner as in the embodiment described above. The cathode 8 may be formed by sequentially laminating lithium fluoride, calcium, aluminum, and the like using the vacuum deposition method, for example. Specifically, in the present embodiment, the cathode 8 is formed using a laminated structure of calcium (20 nm) and aluminum (200 nm). Then, a sealing process is performed as needed. Thus, the organic EL device 200 is completed.

As described above, even in the present embodiment, the insoluble layer F is formed on the first light-emitting layer 50. Accordingly, since the first light-emitting layer 50 does not dissolve at the time of forming the second light-emitting layer 60, the first light-emitting layer 50 and the second light-emitting layer 60 can be successively formed using the ink jet method. As a result, since a material is not wasted in the same manner as in the embodiment described above, a highly reliable organic EL device can be provided with a low cost even in the case when the organic EL device 200 is formed using a large substrate.

Third Embodiment

Figure 5:
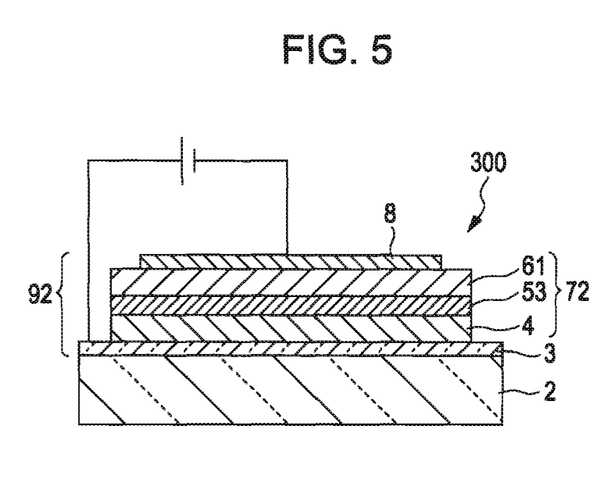
FIG. 5 is a view schematically illustrating the configuration of an organic EL device according to a third embodiment of the invention.

FIG. 5 is a view schematically illustrating the configuration of an organic EL device according to a third embodiment of the invention. An organic EL device 300 includes: an anode 3, a hole injection layer 4, a first light-emitting layer 53, and a second light-emitting layer 61 serving as first electrodes; and a cathode 8 serving as a second electrode, which are formed on a base 2. The hole injection layer 4, the first light-emitting layer 53, and the second light-emitting layer 61 are formed of an organic material, and these organic material layers form an organic functional layer 72. In addition, the organic functional layer 72 is interposed between the anode 3 and the cathode 8. The anode 3, the organic functional layer 72, and the cathode 8 form an organic EL element 92. In the present embodiment, the configuration of the organic EL device 300 is the same as that of the organic EL device 100 according to the first embodiment, which is shown in FIG. 1, except for the organic EL element 9. Accordingly, an explanation below will be focused on the configurations of the first light-emitting layer 53 and the second light-emitting layer 61 and a process of forming the first light-emitting layer 53 and the second light-emitting layer 61, and other explanations will be omitted.

In the same manner as in the second embodiment described above, the compound (PEDOT/PSS) of a polyethylenedioxythiophene and polystyrene sulfonic acid is used for the hole injection layer 4.

In addition, a material containing an organic material, which has a crosslinkable functional group, such as an epoxy group, and is expressed in [Chemical formula 4], and an organic material expressed in [Chemical formula 5], that is, poly[{9,9-dihexylfluorenylenyl-2,7-dilyl}-co-(1,4-vinylenephenylene)] is preferably used for the first light-emitting layer 53. In addition, the first light-emitting layer 53 emits blue light.

[CHEMICAL FORMULA 5]

In the same manner as in the second embodiment described above, the first light-emitting layer 53 has the cross-linked structure in which the first light-emitting layer 53 is not soluble in a liquid material (solvent) used to form the second light-emitting layer 61. Accordingly, the first light-emitting layer 53 becomes a layer (insoluble layer) in which the organic material expressed in [Chemical formula 5] is mixed with the cross-linked organic material expressed in [Chemical formula 4].

The second light-emitting layer 61 is formed by using a light-emitting material which has an organic material expressed in [Chemical formula 6], that is, poly[{9,9-dihexylfluorenylenyl-2,7-dilyl}-co-(9,9'-spirobifluorene-2,7-dilyl)] as a main constituent, and contains 1 to 10 wt % of rubrene. In addition, the second light-emitting layer 61 emits yellow light. Accordingly, the organic EL device 300 according to the present embodiment emits white light as a whole, since the first light-emitting layer 53 that emits blue light and the second light-emitting layer 61 that emits yellow light are laminated. Moreover, the cathode 8 is formed on the second light-emitting layer 60 in the same manner as in the embodiment described above.

[CHEMICAL FORMULA 6]

Method of Manufacturing an Organic EL Device

Next, a method of manufacturing the organic EL device 300 will be described with reference to FIGS. 6A to 6C.

Figure 6A:
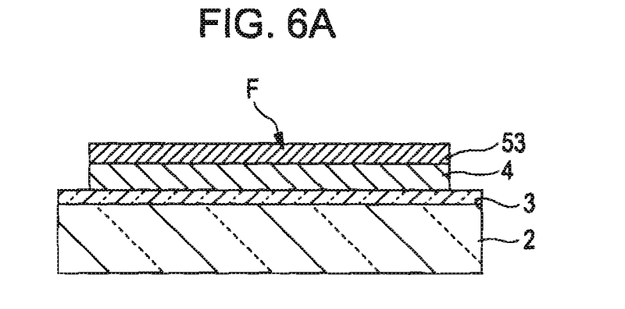
FIG. 6A is a process view explaining a method of manufacturing the organic EL device.

First, as shown in FIG. 6A, the first light-emitting layer 53 is formed on the base 2, on which the anode 3 and the hole injection layer 4 are formed, using the ink jet method (liquid phase method). The first light-emitting layer 53 is formed by disposing a liquid material, which contains the organic material expressed in [Chemical formula 5] and the organic material expressed in [Chemical formula 4], on the hole injection layer 4. In addition, as the film thickness of the first light-emitting layer 53, a thickness of about 30 nm is preferable.

Subsequently, an Insolubilization process is performed on the first light-emitting layer 53 by performing heat treatment (at 130 to 200° C. for 30 minutes) under the inert gas (for example, nitrogen) atmosphere. In the present embodiment, in the same manner as in the second embodiment, an epoxy group which is a crosslinkable functional group of the organic material expressed in [Chemical formula 4] is cross linked by heat treatment. As a result, the insoluble layer F, which is not soluble in a solvent that dissolves a material for forming the second light-emitting layer 61, is formed. That is, the first light-emitting layer 53 functions as the insoluble layer F. Accordingly, the first light-emitting layer 53 does not dissolve in a solvent that dissolves the second light-emitting layer 61 when forming the second light-emitting layer 61 using the ink jet method.

Figure 6B:
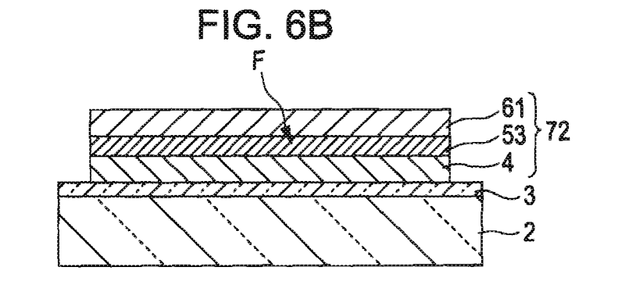
FIG. 6B is a process view explaining a method of manufacturing the organic EL device.

Then, as shown in FIG. 6B, the second light-emitting layer 61 is formed on the first light-emitting layer 53 using the ink jet method. A material and a method of forming the second light-emitting layer 61 are the same as those in the embodiments described above. An aromatic non-polar solvent, such as toluene, xylene, trimethylbenzene, and cyclohexylbenzene, or a mixed solvent thereof is used as a solvent of a material for forming the second light-emitting layer (refer to [Chemical formula 6]). Since the first light-emitting layer 53 becomes a layer that is not soluble in the non-polar solvent by means of the insolubilization process described above, the first light-emitting layer 53 does not dissolve in the solvent even if a liquid material for forming the second light-emitting layer 61 is disposed on the first light-emitting layer 53. Through the processes described above, the first light-emitting layer 53 and the second light-emitting layer 61 that are deposited in succession can be satisfactorily formed using the ink jet method (liquid phase method).

Figure 6C:
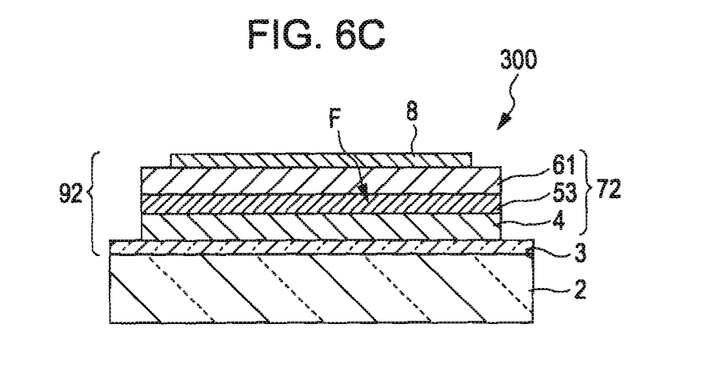
FIG. 6C is a process view explaining a method of manufacturing the organic EL device.

Finally, as shown in FIG. 6C, the cathode 8 is formed on the second light-emitting layer 61 in the same manner as in the embodiments described above. Specifically, in the present embodiment, the cathode 8 is formed by sequentially laminating lithium fluoride, calcium, aluminum, and the like using the vacuum deposition method. Then, a sealing process is performed as needed. Thus, the organic EL device 300 is completed.

As described above, even in the present embodiment, the cross-linked layer is formed on the first light-emitting layer 53. Accordingly, since the first light-emitting layer 53 does not dissolve at the time of forming the second light-emitting layer 61, the first light-emitting layer 53 and the second light-emitting layer 61 can be successively formed using the ink jet method. As a result, since a material is not wasted in the same manner as in the embodiments described above, a highly reliable organic EL device can be provided with a low cost even in the case when the organic EL device 300 is formed using a large substrate.

It should be understood that the invention is not limited to the above-described embodiments, but various modifications can be made within the scope without departing from the spirit of the invention. For example, even though a case in which the first light-emitting layer 5 is formed by using a hole transporting material as a main constituent and the second light-emitting layer 6 is formed by using an electron transporting material as a main constituent has been described in the above embodiments, it may be possible to add 0.5 to 10 wt % of aromatic tertiary amine in the first light-emitting layer 5 and mix 0.5 wt % or less of $Alq_3$ with the first light-emitting layer 5. Alternatively, it may be possible to add 0.5 to 10 wt % of $Alq_3$ in the second light-emitting layer 6 and mix 0.5 wt % or less of aromatic tertiary amine with the second light-emitting layer 6. According to the configuration described above, it is possible to make a light-emitting region large and to absorb deviation of a balance of carriers (electrons or holes) generated under high temperature and high electric field intensity. As a result, it is possible to provide an organic EL device having more stabilized characteristics.

The organic EL device according to the embodiments of the invention can be suitably used as a display unit of an electronic apparatus. An electronic apparatus may include a mobile phone, a wrist watch, a mobile computer, a television, a view finder type or monitor direct view type video tape recorder, a car navigation apparatus, a pager, an electronic diary, a calculator, a word processor, a workstation, a video phone, a POS terminal, and an apparatus having a touch panel. In addition, the organic EL device according to the embodiments of the invention may also be used as a light source of an illumination device, a printer head, or the like.

The entire disclosure of Japanese Patent Application No. 2006-262314, filed Sep. 27, 2006 is expressly incorporated by reference herein.

What is claimed is:

1. A method of manufacturing an organic electroluminescent device having at least two successive light-emitting layers formed between a pair of electrodes, comprising:

ink jetting a first composition on a first electrode to form a first light-emitting layer;

heating the first composition to form an insoluble layer on at least an upper surface of the first light-emitting layer;

ink jetting a second composition on the insoluble layer of the first light-emitting layer to form a second light-emitting layer; and forming a second electrode on the second light-emitting layer, wherein:

the insoluble layer is not soluble in a solvent of the second composition the first composition includes the poly(paraphenylenevinylene) precursor of Formula 1 or the poly(9,9-dioctylfluorene) derivative of Formula 4, (Formula 1)

(Formula 4)

and the poly(paraphenylenevinylene) precursor is conjugated or the poly(9,9-dioctylfluorene) derivative is cross-linked as a result of heating.

2. The method of claim 1, wherein a first electric reduction potential of the first light-emitting layer is larger than a second electric reduction potential of the second light-emitting layer, and a first electric oxidation potential of the first light-emitting layer is smaller than a second electric oxidation potential of the second light-emitting layer.

3. The method of claim 1, wherein heating is performed under an inert gas atmosphere.

4. The method of claim 1, wherein the second light-emitting layer includes an electron transporting material.

5. The method of claim 1, wherein the first composition includes the poly(paraphenylenevinylene) precursor.

6. The method of claim 1, wherein the first composition includes the poly(9,9-dioctylfluorene) derivative and poly[{9,9-dihexyl-2,7-bis(1-cyanovinylene)fluorenylene}-co-{2,5-bis(N—N'-diphenylamino)-1,4-phenylene}].

7. The method of claim 1, wherein the first composition includes the poly(9,9-dioctylfluorene) derivative and poly[{9,9-dihexylfluorenylenyl-2,7-dily}-co-(1,4-vinylenephenylene)].

8. The method of claim 1, wherein the second light-emitting layer includes a polyfluorene copolymer.

9. The method of claim 1, wherein the first composition includes the poly(paraphenylenevinylene) precursor and the second light-emitting layer includes

F8-BT

10. The method of claim 7, wherein the second light-emitting layer includes poly[{9,9-dihexylfluorenylenyl-2,7-dily}-co-(9,9'-spirobifluorene-2,7-dilyl)] as a main constituent and 1 to 10 wt % of rubrene.

11. The method of claim 6, wherein the second light-emitting layer includes

F8-BT

* * * * *